(12) United States Patent
Cadee et al.

(10) Patent No.: US 8,597,014 B2
(45) Date of Patent: Dec. 3, 2013

(54) ACTUATOR

(75) Inventors: Theodorus Petrus Maria Cadee, Vlierden (NL); Noud Jan Gilissen, 's-Gravenzande (NL); Johannes Petrus Martinus Bernardus Vermeulen, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 656 days.

(21) Appl. No.: 12/767,383

(22) Filed: Apr. 26, 2010

(65) Prior Publication Data

US 2010/0272846 A1  Oct. 28, 2010

Related U.S. Application Data

(60) Provisional application No. 61/172,967, filed on Apr. 27, 2009.

(51) Int. Cl.
 *B28B 11/08* (2006.01)

(52) U.S. Cl.
 USPC ............... 425/389; 425/436 R; 425/436 RM; 425/440; 425/445; 425/457; 425/468

(58) Field of Classification Search
 USPC ...... 425/436 R, 436 RM, 440, 445, 389, 457, 425/468; 254/93 HP
 See application file for complete search history.

(56) References Cited

U.S. PATENT DOCUMENTS

| | | | |
|---|---|---|---|
| 4,731,155 A | 3/1988 | Napoli et al. | |
| 4,771,790 A * | 9/1988 | Yamasawa et al. | 600/499 |
| 5,772,905 A | 6/1998 | Chou | |
| 6,334,960 B1 | 1/2002 | Willson et al. | |
| 6,832,776 B1 * | 12/2004 | Soderstrom | 280/730.1 |
| 6,994,541 B2 * | 2/2006 | Chung et al. | 425/389 |
| 2003/0081193 A1 | 5/2003 | White et al. | |
| 2004/0124566 A1 | 7/2004 | Sreenivasan et al. | |
| 2005/0006343 A1 | 1/2005 | Choi et al. | |
| 2005/0274693 A1 | 12/2005 | Heidari et al. | |
| 2006/0139601 A1 * | 6/2006 | Hoogenraad | 355/67 |
| 2006/0279022 A1 | 12/2006 | Seki et al. | |

FOREIGN PATENT DOCUMENTS

| | | |
|---|---|---|
| JP | 05-015485 | 1/1993 |
| JP | 09-079213 | 3/1997 |
| JP | 2004-056125 | 2/2004 |
| WO | 02/067055 A2 | 8/2002 |
| WO | 2007/132320 A2 | 11/2007 |
| WO | 2009/153925 | 12/2009 |

OTHER PUBLICATIONS

JPO English machine translation of JP 09079213, retrieved from JPO database Sep. 11, 2012.*
Japanese Office Action mailed Jan. 31, 2012 in corresponding Japanese Patent Application No. 2010-096552.
J. Haisma et al., "Mold-assisted nanolithography: A process for reliable pattern replication," J. Vac. Sci. Technol. B 14 (6), Nov./Dec. 1996, pp. 4124-4128.

* cited by examiner

*Primary Examiner* — Timothy Kennedy
(74) *Attorney, Agent, or Firm* — Pillsbury Winthrop Shaw Pittman LLP

(57) ABSTRACT

An actuator is disclosed that includes a body, the body having a face, and a plurality of conduits located in the body, each conduit deformable in response to a change of pressure within the conduit, the deformation of the conduit configured to cause a deformation of the face.

21 Claims, 10 Drawing Sheets

ACTUATOR

This application claims priority and benefit under 35 U.S.C. §119(e) to U.S. Provisional Patent Application No. 61/172,967, entitled "An Actuator", filed on Apr. 27, 2009. The content of that application is incorporated herein in its entirety by reference.

FIELD

The present invention relates to an actuator. In particular, although not exclusively, the actuator may be used in lithography.

BACKGROUND

In lithography, there is an ongoing desire to reduce the size of features in a lithographic pattern in order to increase the density of features on a given substrate area. In photolithography, the push for smaller features has resulted in the development of technologies such as immersion lithography and extreme ultraviolet (EUV) lithography, which are however rather costly.

A potentially less costly road to smaller features that has gained increasing interest is so-called imprint lithography (and in particular nano-imprint lithography), which generally involves the use of a "stamp" (often referred to as an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

Imprint lithography involves the patterning of an imprintable medium on a surface of a substrate to be patterned. The patterning may involve pressing a patterned surface of an imprint template onto a layer of imprintable medium, and/or vice versa, such that the imprintable medium flows into recesses in the patterned surface and is pushed aside by protrusions on the patterned surface. Pressing may not be required in some embodiments, where instead capillary forces may be sufficient to ensure that the imprintable medium flows into one or more recesses in the patterned surface and is pushed aside by one or more protrusions on the patterned surface. The recesses define pattern features of the patterned surface of the imprint template. Typically, the imprintable medium is flowable when the patterned surface and the imprintable medium are together. Following patterning of the imprintable medium, the imprintable medium is suitably brought into a non-flowable or frozen state and the patterned surface of the imprint template and the patterned imprintable medium are separated. The substrate and patterned imprintable medium are then typically processed further in order to pattern or further pattern the substrate. The imprintable medium is typically formed from resist droplets on the surface of a substrate to be patterned.

SUMMARY

In order to accurately and consistently apply a pattern in the imprintable medium, which is particularly important for CMOS applications, it is sometimes necessary to deform the imprint template. The imprint template may be deformed to take into account or compensate for thermal expansion of the imprint template or substrate, or to account for magnification error or an anomaly. In order to deform the imprint template, one or more actuators may be disposed around the imprint template. One or more of these actuators may be activated to push against or pull a portion of the imprint template to establish the desired deformation of the imprint template.

A disadvantage to using an actuator arrangement that surrounds the imprint template is that the footprint of the actuator arrangement and imprint template as a whole is considerably larger than the footprint of the imprint template in isolation. The increase in the footprint is disadvantageous, since it limits the extent to which multiple imprint templates can be located alongside one another and used, for example, for parallel or simultaneous imprinting of the imprint templates. This may limit the number of patterns that can be applied to a substrate provided with an imprintable medium, or this may increase the time taken to provide patterns in imprintable medium on the substrate. In either example, throughput may be decreased.

Furthermore, the actuator arrangement adds mass to the imprint template. This may make it more difficult to accelerate/decelerate the imprint template at a rate to help ensure a high throughput when patterning imprintable medium on a substrate.

Such issues are particularly relevant to imprint lithography, where throughput is low in comparison with, for example, optical lithography. However, the same or similar issues arise with the deformation and/or movement of other apparatus that may require deformation, such as, for example, a lens element, a reflective element, a transmissive element, a mask element, or a substrate holder.

It is desirable, for example, to provide an actuator which may obviate or mitigate at least one problem identified herein or elsewhere.

According to an aspect of the invention, there is provided an actuator comprising: a body, the body comprising a face; and a plurality of conduits located in the body, each conduit deformable in response to a change of pressure within the conduit, the deformation of the conduit configured to cause a deformation of the face.

The face may comprise, or be attached to, at least one apparatus selected from the following apparatuses: a lens element, a reflective element, a transmissive element, a mask element, an imprint lithography template, a substrate holder, or a diffuser.

An end of each conduit may be proximate to the face, such that deformation of the conduit causes a deformation of the face. Proximate may be defined as the conduit being at a distance from the face which is of the order of magnitude or more than the elongate dimension of the conduit.

A surface of the face may be the same size or larger than a cross-section of the body, or a surface of the face may be the same size or smaller than the apparatus. This means the presence of the actuator does not increase the footprint of the face or the apparatus.

Each conduit may have a cross-section which is elongate, each conduit deformable in a direction substantially transverse to a direction of elongation of the cross-section of the conduit, the deformation of the conduit configured to cause a deformation of the face in a direction that is substantially parallel to the direction of deformation of the conduit.

One or more of the plurality of conduits have may have a cross-section with a direction of elongation in a first direction, and one or more of the plurality of conduits have a cross-section with a direction of elongation in a second, different direction, the first direction being substantially perpendicular to the second direction.

The plurality of conduits may extend substantially parallel to one another.

The plurality of conduits may extend in a substantially perpendicular direction away from the face.

Each conduit may have a length which is greater than a dimension of the cross-section of the respective conduit.

The cross-section of each conduit may be three times or more longer than it is wide.

The cross-section of each conduit may have a dimension of the order of millimetres or less.

The body or face may be substantially transmissive to UV radiation.

In use, the pressure of a fluid in one or more of the plurality of conduits may be changed to change the pressure within the conduit, wherein the fluid has a refractive index which is substantially the same as the refractive index of the body or the face.

The cross-section of each conduit may have a shape which is substantially that of: a circle, an oval, an ellipse, a rectangle, a square, a square with one or more rounded corners, or a rectangle with one or more rounded corners. One or more conduits may have different cross-sections, for example to limit the cross talk between the deformations of adjacent conduits.

The actuator may comprise one or more conduits extending substantially parallel to the face, each parallel conduit deformable in response to a change of pressure within the parallel conduit, the deformation of the conduit configured to cause a deformation of the face.

The actuator may further comprise a plurality of actuators disposed substantially adjacent to one another.

BRIEF DESCRIPTION OF THE DRAWINGS

Specific embodiments of the invention will be described with reference to the accompanying figures, in which.

DETAILED DESCRIPTION

Figure 1A:
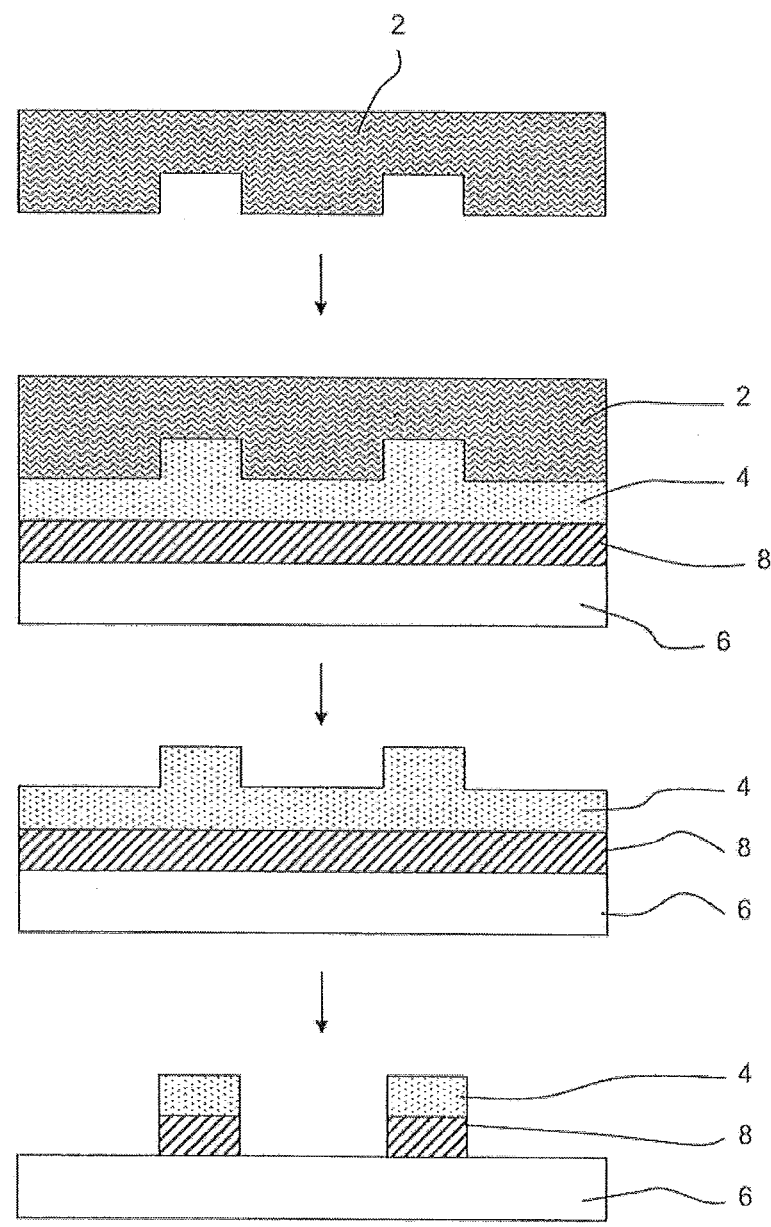
FIGS. 1a and 1b schematically depict examples of, respectively, hot imprint, and UV imprint lithography.
Figure 1B:
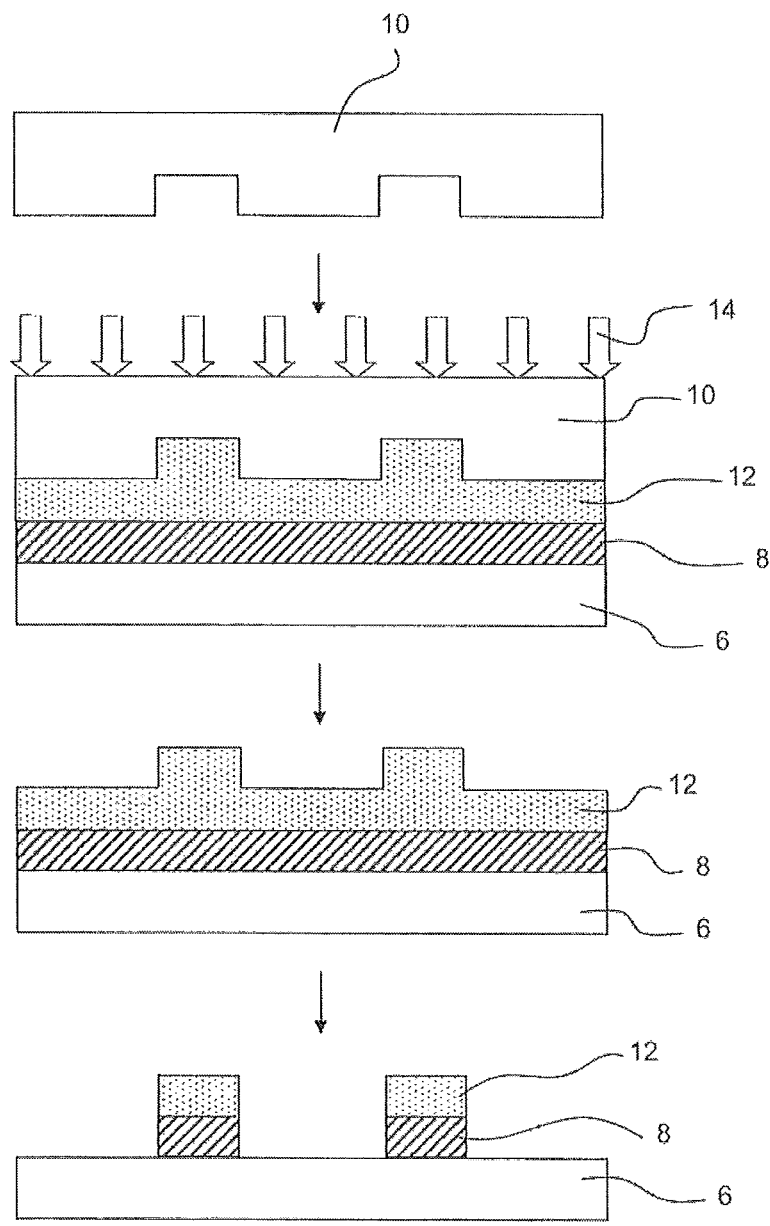

Examples of two known approaches to imprint lithography are schematically depicted in FIGS. 1a to 1b.

FIG. 1a shows an example of so-called hot imprint lithography (or hot embossing). In a typical hot imprint process, a template 2 is imprinted into a thermosetting or a thermoplastic imprintable medium 4, which has been cast on the surface of a substrate 6. The imprintable medium 4 may be, for example, resin. The resin may for instance be spin coated and baked onto the substrate surface or, as in the example illustrated, onto a planarization and transfer layer 8 of the substrate 6. When a thermosetting polymer resin is used, the resin is heated to a temperature such that, upon contact with the template, the resin is sufficiently flowable to flow into the pattern features defined on the template. The temperature of the resin is then increased to thermally cure (crosslink) the resin so that it solidifies and irreversibly adopts the desired pattern. The template 2 may then come out of contact with the resin and the patterned resin cooled. In hot imprint lithography employing a layer of thermoplastic polymer resin, the thermoplastic resin is heated so that it is in a freely flowable state immediately prior to imprinting with the template 2. It may be necessary to heat a thermoplastic resin to a temperature considerably above the glass transition temperature of the resin. The template comes into contact with the flowable resin and then cooled to below its glass transition temperature with the template 2 in place to harden the pattern. Thereafter, the template 2 comes out of contact with the resin. The pattern will consist of the features in relief from a residual layer of the resin which may then be removed by an appropriate etch process to leave only the pattern features. Examples of thermoplastic polymer resins used in hot imprint lithography processes are poly (methyl methacrylate), polystyrene, poly (benzyl methacrylate) or poly (cyclohexyl methacrylate). For more information on hot imprint, see e.g. U.S. Pat. Nos. 4,731,155 and 5,772,905.

FIG. 1b shows an example of UV imprint lithography, which involves the use of a transparent or translucent template which is transmissive to UV and a UV-curable liquid as imprintable medium (the term "UV" is used here for convenience but should be interpreted as including any suitable actinic radiation for curing the imprintable medium). A UV curable liquid is often less viscous than the thermosetting or thermoplastic resin used in hot imprint lithography and consequently may move much faster to fill template pattern features. A quartz template 10 is applied to a UV-curable imprintable medium (e.g., resin) 12 in a similar manner to the process of FIG. 1a. However, instead of using heat or temperature cycling as in hot imprint, the pattern is frozen by curing the imprintable medium with UV radiation 14 that is applied through the quartz template onto the imprintable medium. After the template comes out of contact with the imprintable medium, the pattern will consist of the features in relief from a residual layer of the imprintable medium which may then be removed by an appropriate etch process to leave only the pattern features. A particular manner of patterning a substrate through UV imprint lithography is so-called step and flash imprint lithography (SFIL), which may be used to pattern a substrate in small steps in a similar manner to optical steppers conventionally used in IC manufacture. For more information on UV imprint, see e.g. U.S. Patent Application Publication No. 2004-0124566, U.S. Pat. No. 6,334,960, PCT Patent Application Publication No. WO 02/067055, and the article by J. Haisma entitled "Mold-assisted nanolithography: A process for reliable pattern replication", J. Vac. Sci. Technol. B14(6), November/December 1996.

Combinations of the above imprint techniques are possible. See, e.g., U.S. Patent Application Publication No. 2005-0274693, which mentions a combination of heating and UV curing an imprintable medium.

During or before an imprint template is imprinted into imprintable medium, it may be desirable to at least partially deform the imprint template. Such deformation may be used to, for example, take into account thermal deformation of the imprint template or substrate, or to make a magnification correction or the like.

Figure 2:
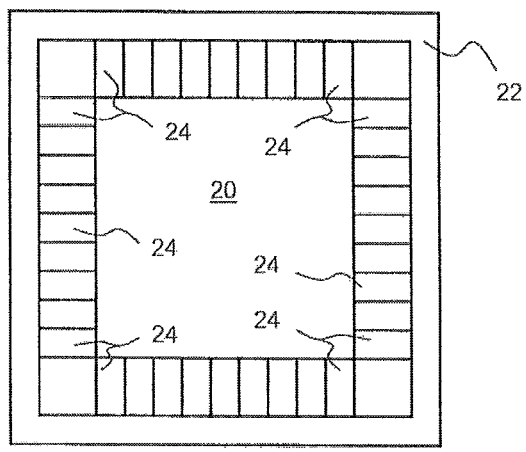
FIG. 2 schematically depicts a plan view of an imprint template and actuator assembly.

FIG. 2 depicts an arrangement to deform an imprint template. An imprint template 20 is shown. Surrounding the imprint template 20 is an actuator support structure 22. The actuator support structure 22 supports a plurality of actuators 24 which extend from the actuator support structure 22 and into contact with a peripheral face of the imprint template 20. The actuators 24 may be, for example, piezoelectric actuators or the like. One or more of the actuators 24 may be activated to push against or pull a part of the imprint template 20 to cause appropriate deformation of the imprint template 20.

Figure 3:
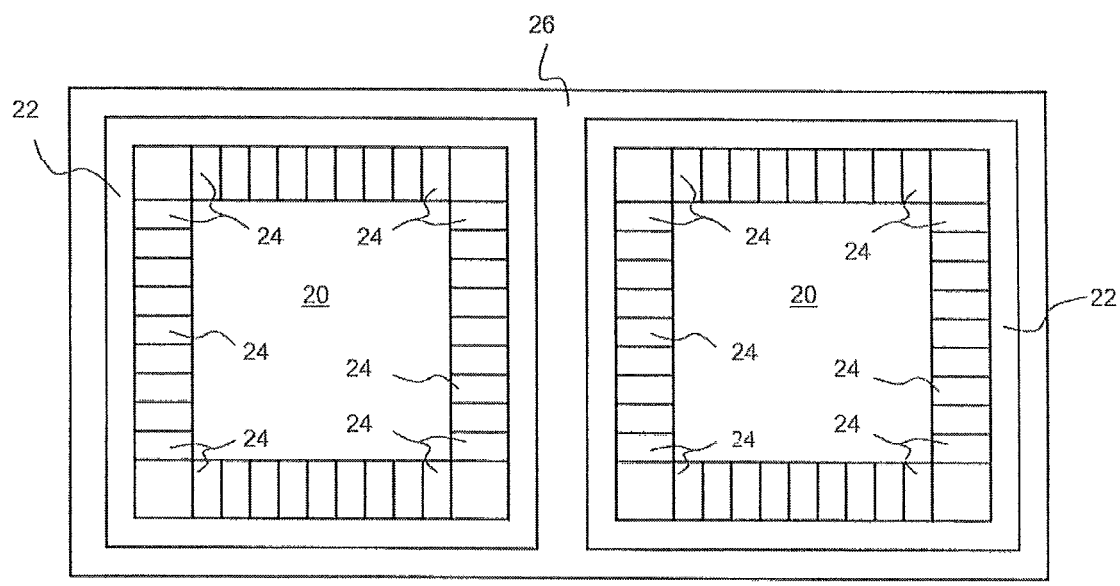
FIG. 3 schematically depicts a multiple imprint template arrangement with corresponding actuator arrangements.

The footprint of the actuator support structure 22, actuators 24, and imprint template 20 is considerably larger than the footprint of the imprint template 20 in isolation. Furthermore, the mass of the actuator support structure 22, actuator 24 and imprint template 20 is considerably larger than the mass of the imprint template 20 in isolation. The increase of the footprint and mass is further exaggerated when a multiple imprint template system is considered. FIG. 3 shows such a multiple imprint template system. The multiple imprint template system comprises at least two imprint templates 20 disposed along side one another or in a two-dimensional array. Each imprint template 20 is surrounded by a plurality of actuators 24, the actuators each being supported by an actuator support structure 22. The actuator support structures 22 are coupled together by a coupling 26, which may be, for example, a frame or the like. The footprint and mass of the multiple imprint template system shown in FIG. 3 is considerably larger than the footprint and mass of two imprint templates 20 in isolation.

The increase in the footprint makes it more difficult to locate imprint templates immediately adjacent to one another. This means that it may not be possible to use (i.e. pattern) an area of imprintable medium which lies between the two imprint templates during an imprint, or this may mean that further imprinting may be required to imprint a pattern into this area. This may lead to less patterns being applied to the imprintable medium, or to more time being taken to imprint patterns into the imprintable medium. In either example, throughput is reduced.

The increase in mass may mean that it is more difficult to accelerate/decelerate the imprint template, actuator support structure and actuators during imprinting. This may lead to a reduction in throughput.

It is desirable, for example, to provide an actuator which does not substantially (or at all) increase the footprint of an imprint template, and/or significantly increase the mass of an imprint template, in comparison with prior art actuator assemblies. More generally, it is desirable, for example, to provide an actuator which does not substantially (or at all) increase the footprint of an apparatus to be deformed by the actuator, and/or to significantly increase the mass of the apparatus, in comparison with prior art actuator/apparatus assemblies. Examples of an apparatus may include, e.g., a lens element, a reflective element, a transmissive element, a mask element, or a substrate holder.

Figure 4:
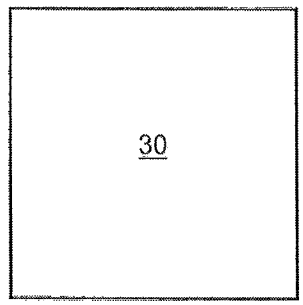
FIG. 4 schematically depicts a useable area of an element.
Figure 5:
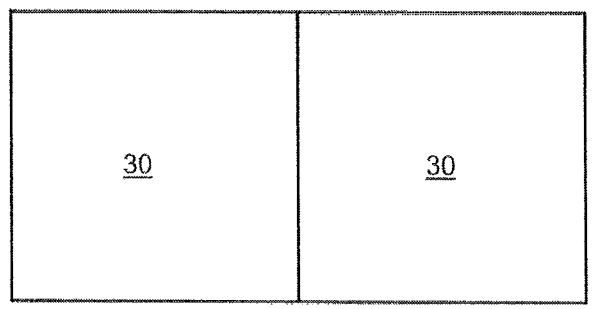
FIG. 5 schematically depicts the useable areas of two elements when the elements are disposed alongside one another.

FIGS. 4 and 5 schematically depict an aim of an embodiment of the invention. FIG. 4 schematically depicts a usable area of an element 30. The usable area could comprise or be, for example, an area of protrusions or recesses for use in imprinting, a reflective element such as a mirror, a transmissive element such as a lens, a part or all of a transmissive or reflective mask, or a substrate table, or any other suitable apparatus. In the embodiment of FIG. 4, one or more actuators to deform the usable area 30 are not shown, since they lie primarily behind the useable area 30. Because the actuator lies primarily behind the usable area 30, the footprint of the actuator and usable area 30 substantially corresponds to the footprint of the usable area 30 in isolation. FIG. 5 shows two such areas 30 located immediately adjacent to one another. The areas 30 can be located immediately adjacent to one another because the footprint of the actuator and the useable areas 30 substantially corresponds to the footprint of the useable areas 30 in isolation.

Figure 6:
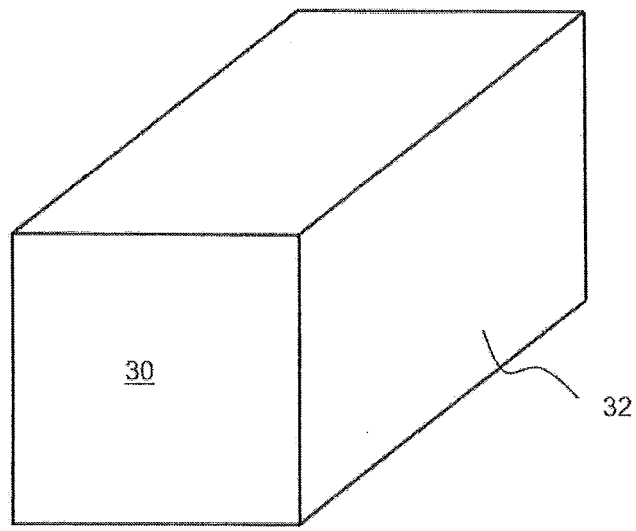
FIG. 6 schematically depicts the useable area of an element, together with an actuator to deform an area of that element.
Figure 7:
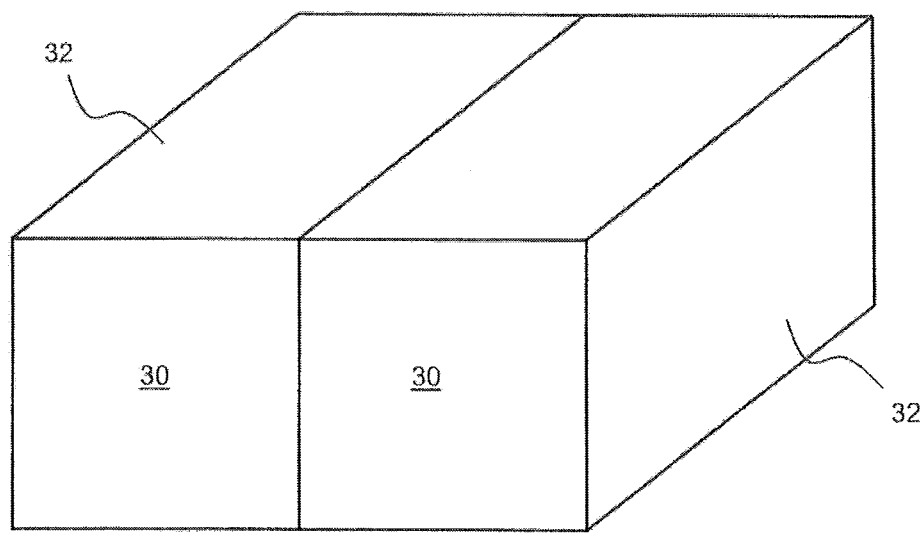
FIG. 7 schematically depicts the useable areas of two elements, and an associated actuator to deform an area of those useable areas, when the elements are disposed adjacent to one another.

FIGS. 6 and 7 schematically depict in perspective view the elements shown in FIGS. 4 and 5, respectively. An actuator 32 to deform the usable area 30 of each element is located primarily behind the useable area 30, thus substantially corresponding to the footprint of the element in a plane in which the useable area 30 extends.

According to an embodiment, an actuator is provided. A body of the actuator is provided with a face. The body of the actuator comprises a plurality of conduits which extend away from the face. In an embodiment, each conduit is deformable by appropriate change of the pressure within the conduit. Deformation of the conduits causes deformation of the face of the actuator. Deformation of the face of the actuator can be used to cause deformation of an apparatus attached to that face. In another example, the face itself may be the apparatus for which deformation is desirable.

Embodiments of the present invention will now be described, by way of example only, with reference to FIGS. 8 to 25.

Figure 8:
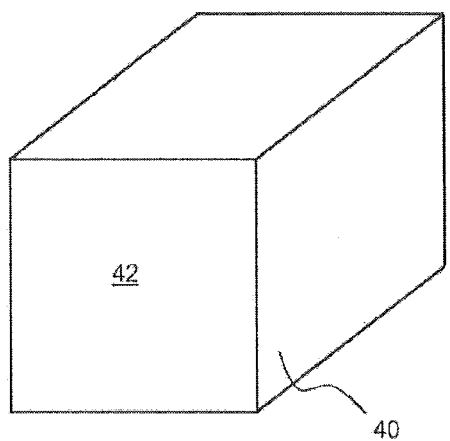
FIG. 8 schematically depicts a front perspective view of an actuator in accordance with an embodiment of the present invention.

FIG. 8 is a perspective view of an actuator in accordance with an embodiment of the present invention. The actuator comprises a body 40. The body is provided with a face 42. As will be discussed in more detail below, the face 42 may be deformed and, in turn, deform an apparatus attached to the face 42. In another example, the face 42 itself may be, or comprise, the apparatus for which deformation is desirable.

The body 40 contains a plurality of conduits (not shown in FIG. 8) which extend away from the face 42. The conduits extend away from the face 42 in a direction which is substantially perpendicular to the face 42. The footprint of the conduits (i.e. actuating elements) substantially corresponds to the footprint of the face 42, or apparatus forming part of or attached to that face 42.

Figure 9:
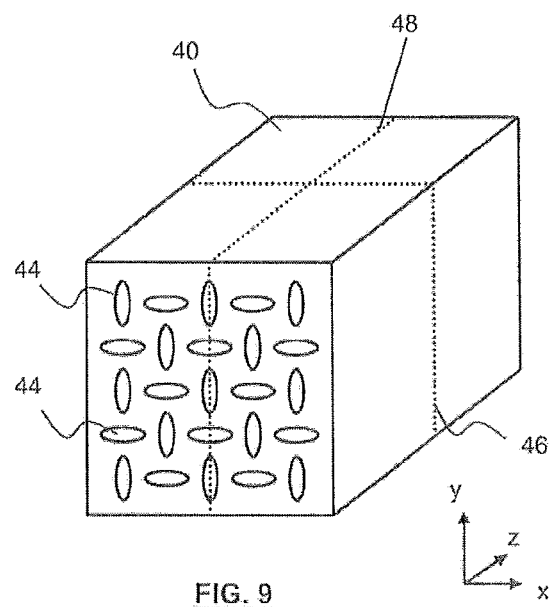
FIG. 9 schematically depicts a rear perspective view of the actuator of FIG. 8.

FIG. 9 depicts a rear perspective view of the actuator of FIG. 8. A plurality of conduits 44 is shown. Each conduit 44 has a cross-section which is elongate (i.e. one dimension of the cross-section is longer than another dimension of the cross-section of the conduit 44). A plurality of the conduits 44 have a cross-section with a direction of elongation in a first direction (e.g. in the x-direction as shown in FIG. 9), and another plurality of conduits have a cross-section with a direction of elongation in a second, different direction (e.g. in the y-direction as shown in FIG. 9). The first direction is substantially perpendicular to the second direction.

Figure 10:
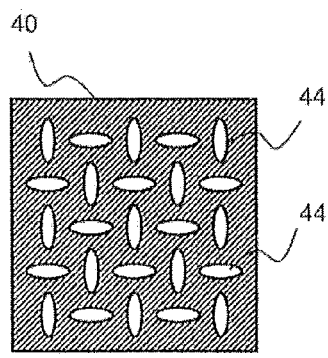
FIG. 10 schematically depicts a cross-sectional view of the actuator of FIGS. 8 and 9.
Figure 11:
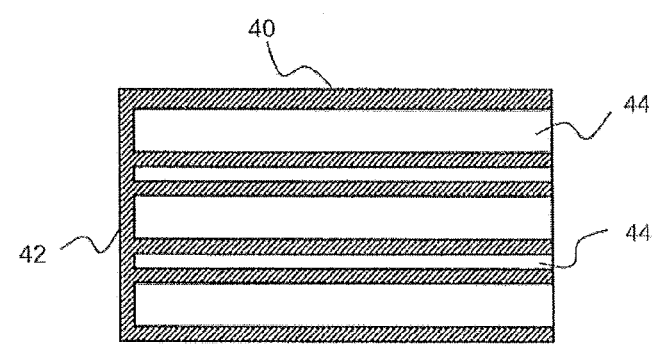
FIG. 11 schematically depicts a further cross-sectional view, perpendicular to that of FIG. 10, of the actuator of FIGS. 8 and 9.

FIG. 10 is a cross-sectional view through the actuator taken in the z-direction as shown in FIG. 9, relative to an x-y plane 46. FIG. 11 is a cross-sectional view through the actuator taken in the x-direction of FIG. 9, relative to a y-z plane 48. FIGS. 10 and 11 will be referred to in combination.

Referring to FIGS. 10 and 11, the plurality of conduits 44 extend substantially parallel to one another through the body 40. Furthermore, the plurality of conduits 44 extends in a substantially perpendicular direction away from the face 42 of the actuator. As discussed above, this may allow the footprint of the actuator in the plane of the face 42 to be minimized, since the actuating elements of the actuator (i.e. the conduits 44) are located behind the face 42, and do not surround the face. The conduits 44 do not extend through the face 42. Instead, an end of each conduit 44 is proximate to the face 42, such that deformation of the conduit 44 is able to cause deformation of the face 42. Proximate may be defined as the conduit being at a distance from the face which is of the order of magnitude or more than the elongate dimension of the conduit.

The conduits 44 may be formed in the body 40 in any appropriate manner. In one example, the conduits 44 may be formed in the body 40 by drilling or the like. In a further example, the body 40 and conduits 44 may be formed together by extrusion or the like. In a further example, each conduit 44 could be individually formed, and the individual conduits 44 attached to each other to form a plurality of conduits 44. In this example, the body 40 of the actuator may be considered as the walls of the conduits 44. The face 42 of the actuator may be formed during the formation of the conduits 44. In an example, the face 42 of the actuator may be provided separately to enclose an end of the conduits 44. The actuator may be formed from any suitable material. The material may be chosen to have specific properties, such as being substantially transmissive to UV radiation (e.g. radiation having a wavelength of 300 nm-450 nm). For instance, the actuator may be formed from quartz.

Figure 12:
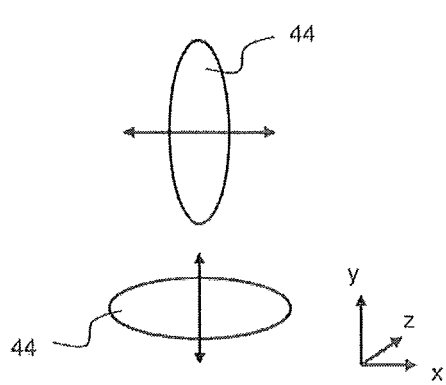
FIG. 12 schematically depicts conduits of the actuator of FIGS. 8 to 11.

FIG. 12 schematically depicts two conduits 44. The conduits 44 are elongate, in that one dimension of the cross-section of the conduit is longer than another dimension of the cross-section of the conduit 44. The cross-section of each of the conduits of FIG. 12 is shown as being elliptical. However, the cross-section of the conduit 44 may have any appropriate elongate shape, and may for example have a shape that is substantially that of an oval, an ellipse, a square, a square with one or more rounded corners, a rectangle, a rectangle with one or more rounded corners, or the like. One or more conduits may have different cross-sections, for example to limit the cross talk between the deformations of adjacent conduits. Due to the elongation of the cross-section of the conduits 44, the conduits 44 are deformable in a direction transverse to the direction of elongation of the cross-section. The direction of deformation of each conduit 44 is schematically depicted in FIG. 12 by arrows. The deformation may be achieved by appropriate change of pressure within the conduit. The change in pressure may be achieved by increasing the flow of fluid within the conduit 44, or by increasing the static pressure on a fluid within the conduit 44.

FIG. 12 shows that conduits 44 may be deformed in a direction transverse to the direction of elongation of their cross-section. Thus, in an embodiment, if the direction of elongation of the cross-section of the conduit 44 is in the y-direction, the deformation will mainly occur in the x-direction. Similarly, if the direction of elongation of the cross-section of the conduit 44 is in the x-direction, the deformation will mainly occur in the y-direction.

Each conduit may have a length that is greater than a dimension (e.g. a length, width, radius or diameter) of the cross-section of the respective conduits 44. This allows deformation to take place more readily when the pressure within the conduit 44 is changed. Furthermore, in order to promote the conditions for deformation, the cross-section of each conduit 44 may be three times or more longer than the cross-section is wide, and, for example, up to twenty times longer than the cross-section is wide. The dimensions of the cross-section of each conduit 44 may be dependent on the desired deformation, and of the material property of the face or apparatus for which deformation is desired. Typically, the cross-section of each conduit 44 has a dimension of the order of millimeters, down to a few tenths of a millimeter and up to about 10 mm. The conduit 44 may be, for example, 10 mm long, or longer than 10 mm up to 100 mm.

Figure 13:
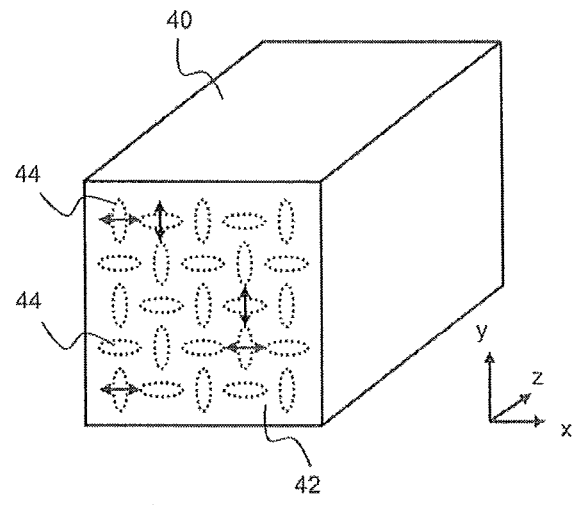
FIG. 13 schematically depicts deformation of a face of the actuator of FIGS. 8 to 11 as a consequence of deformation of one or more of a plurality of conduits within the body of the actuator.

FIG. 13 schematically depicts a perspective view of the actuator. The dashed outlines of conduits 44 are shown, the lines being dashed since the conduits do not extend to the face 42, but terminate behind the face 42 within the body 40 of the actuator. Arrows on the face 42 of the actuator schematically depict deformation of that region of the face 42. The deformation is caused by deformation of the conduits 44 which terminate (i.e. end) behind that region of the face 42. The arrows shown on the face 42 depict how deformation can be achieved in more than one dimension, and in localized regions, or regions that are remote from one another. The deformation of the face 42 is an in-plane deformation, since the deformation of the conduits 42 is in a direction substantially parallel to a plane in which the face 42 lies (i.e. a plane extending in the x-y direction, as shown in FIG. 13).

Figure 14:
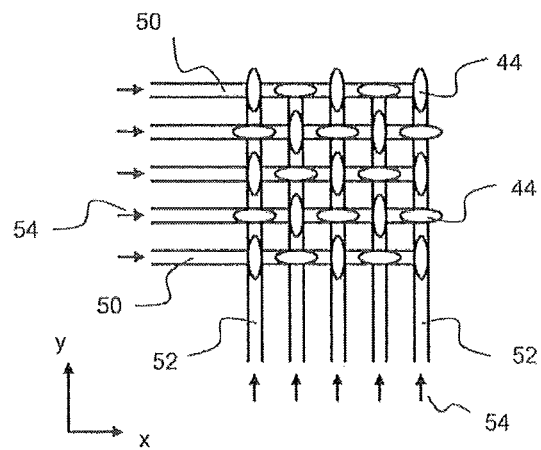
FIG. 14 schematically depicts an arrangement for changing the pressure in one or more conduits of the actuator.

FIG. 14 schematically depicts an arrangement for changing the pressure in the conduits of the actuator. Open ends of conduits 44 are shown. The open ends of the conduits 44 are remote from the ends of the conduits that are proximate to the face of the actuator (not shown in the Figure). Each conduit 44 having a cross section with a direction of elongation in the x-direction is in fluid connection with a supply channel 50 extending in the x-direction. Each conduit 44 having a cross section with a direction of elongation in the y-direction is in fluid connection with a supply channel 52 extending in the y-direction. Conduits 44 located in the same row of conduits 44 and having a cross section with a direction of elongation in the x-direction are supplied by the same supply channel in the x-direction. Similarly, conduits 44 within the same column of conduits 44 and having a cross section with a direction of elongation in the y-direction are supplied by the same supply channel 52 extending in the y-direction. The pressure within the conduits 44 may be changed (or, more generically speaking, controlled) by appropriate change (or more generically speaking, control) of the pressure of fluid 54 within the supply channels 50, 52. The pressure can be changed by increasing or decreasing the flow of the fluid 54 in the supply channels 50, 52, or by increasing or decreasing the static pressure of the fluid 54 in the supply channels 50, 52. It will be appreciated that, in this embodiment, as well as all other embodiments, the pressure can be increased as well as decreased. For instance, the pressure could be decreased by reducing the pressure below a nominal level, or by partial evacuation of one or more conduits, via for example, one or more supply channels, 50, 52. The fluid 54 could be a gas or a liquid. The fluid may have one or more desirable properties, such as being transmissive to UV radiation (e.g. radiation having a wavelength of 300 nm-450 nm), or having an index of refraction which matches that of the body or face of the actuator.

Figure 15:
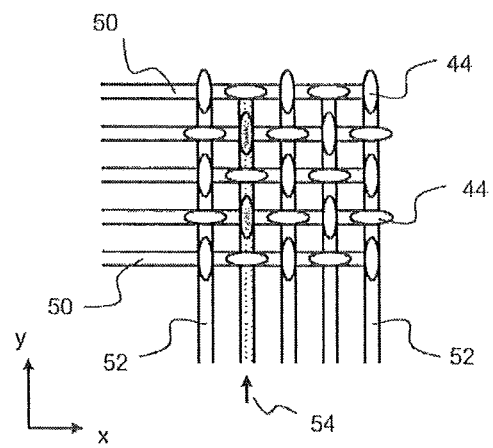
FIG. 15 schematically depicts the changing of the pressure within a specific conduit using the arrangement shown in FIG. 14.

FIG. 15 schematically depicts how particular conduits 44 can be deformed using the arrangement shown in FIG. 14. Referring to FIG. 15, the pressure within a single supply channel in the y-direction 52 is increased. The increase in pressure in the supply channel in the y-direction 52 causes the pressure in each conduit 44 that is connected to that channel 52 to also increase. The pressure change causes these specific conduits (the specific conduits being shaded in FIG. 15) to deform. It will be appreciated that, using this arrangement, the pressure within any specific conduit or number of conduits can be changed in a selective and controlled manner, meaning that the deformation on the face of the actuator can also be deformed in a controlled and selective manner.

In the embodiment of FIGS. 14 and 15, the pressure within a plurality of conduits having a cross section with a direction of elongation in the same direction may be changed (e.g. controlled) by changing the pressure within a single supply channel. One or more conduits that are connected to the same supply channel may be excluded from the change in pressure by the selective engagement of a blocking arrangement, such as a valve or the like. Such an arrangement would allow greater control of the pressure within one or more conduits that are connected to a supply channel. Such greater control could alternatively or additionally be achieved by providing, for example, a pressure control arrangement for each individual conduit, or a selected group of conduits.

In the embodiment of FIGS. 14 and 15, selected conduits are in fluid connection with a supply channel 50 extending in the x-direction or a supply channel 52 extending in the y-direction. In an embodiment, the supply channels may extend in a z-direction, orthogonal to the x and y directions shown. This may reduce or further reduce the footprint of the actuator, or the apparatus used to control the actuator.

It will be understood that the embodiment of FIGS. 14 and 15 is given by way of example only. In an embodiment, each conduit having a cross section with a direction of elongation in the x-direction may be in fluid connection with a supply channel 52 extending in the y-direction. Each conduit having a cross section with a direction of elongation in the y-direction may be in fluid connection with a supply channel 50 extending in the x-direction. Thus, in this embodiment, conduits located in the same column of conduits and having a cross section with a direction of elongation in the x-direction are supplied by the same supply channel in the y-direction. Similarly, conduits within the same row of conduits and having a cross section with a direction of elongation in the y-direction are supplied by the same supply channel extending in the x-direction.

Figure 16:
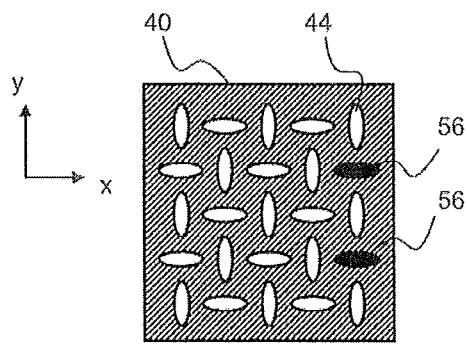
FIG. 16 schematically depicts the change in pressure of two specific conduits of the actuator.
Figure 17:
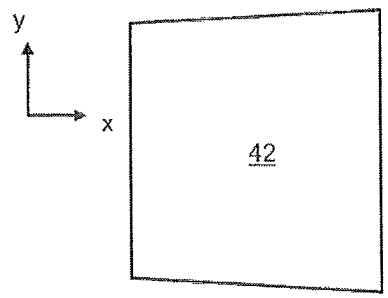
FIG. 17 schematically depicts the deformation of the face of the actuator as a consequence of the change in pressure of the two conduits of FIG. 16.

FIG. 16 is a cross-sectional view of the actuator, showing the conduits 44 extending through the body 40 of the actuator. The pressure within two specific conduits 56 (dark shading in FIG. 16) has been increased to cause deformation of the conduits 56 in the y-direction. FIG. 17 shows the resultant deformation of the face 42 of the actuator. The deformation of the face 42 is in the y-direction, and the deformation is located in the vicinity of the conduits that were deformed.

Figure 18:
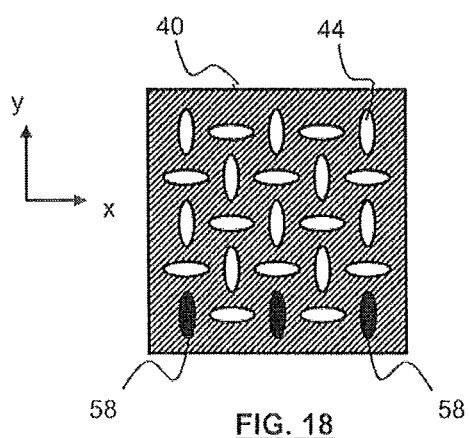
FIG. 18 schematically depicts the change in pressure of three specific conduits of the actuator.
Figure 19:
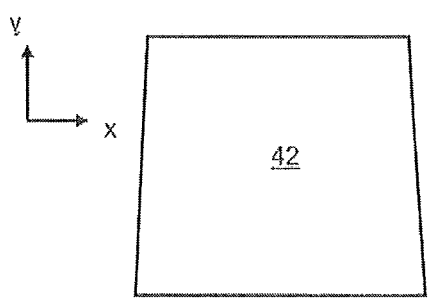
FIG. 19 schematically depicts the deformation of the face of the actuator as a consequence of the change in pressure of the three conduits of FIG. 18.

FIG. 18 is a cross-sectional view of the actuator, showing the conduits 44 extending through the body 40 of the actuator. The pressure within three specific conduits 58 (dark shading in FIG. 18) has been increased to cause deformation of the conduits 58 in the x-direction. FIG. 19 shows the resultant deformation of the face 42 of the actuator. The deformation of the face 42 is in the x-direction, and the deformation is located in the vicinity of the conduits that were deformed.

Deformation of the face of the actuator may be taken advantage of in one of a number of ways. In one example, the face of the actuator may be, or comprise, an apparatus, the deformation of which is desirable. In another embodiment, the face may be attached to such apparatus. The apparatus may be, for example, a lens element, a reflective element, a transmissive element, a mask element, an imprint lithography template or part thereof, a substrate holder or part thereof, or a diffuser. The apparatus may be formed integrally with the actuator or the face of the actuator. The apparatus may be attached to the face of the actuator. The apparatus may be attached to the face of the actuator in one of a number of ways. For instance, the attachment could be achieved by the use of an adhesive or permanent fixing agent or the like. In another example, the attachment may be achieved using magnetic, electrostatic, or vacuum forces. The permanent or otherwise nature of the attachment may depend on the application in which the actuator is used, as the skilled person will appreciate. For instance, it may be desirable to use a single actuator with different apparatus, meaning that the attachment between the actuator and any given piece of apparatus is desirably not permanent. In another example, it may be the intention to use an actuator only with a single piece of apparatus, meaning that the attachment between the actuator and the apparatus can be permanent.

Figure 20:
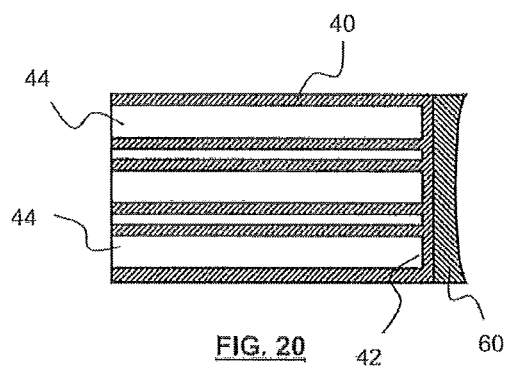
FIG. 20 schematically depicts a cross-sectional view of the actuator according to an embodiment of the present invention, wherein a face of the actuator is, or is provided with, a reflective element.

FIG. 20 schematically depicts a cross-sectional view taken through a plane extending longitudinally through the actuator. In this embodiment, a reflective element 60 (e.g. a mirror or part thereof) is shown as being attached to the face 42 of the actuator. In another embodiment, the reflective element may be the face of the actuator.

Figure 21:
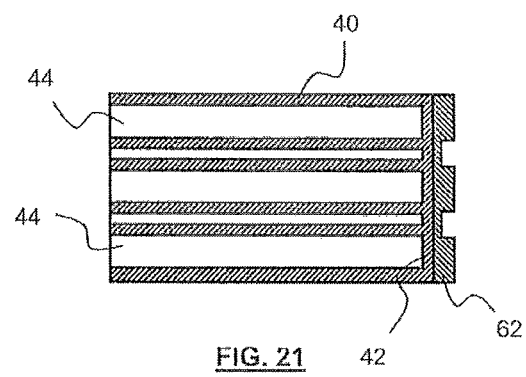
FIG. 21 schematically depicts a cross-sectional view of the actuator according to an embodiment of the present invention, wherein a face of the actuator is, or is provided with, an imprint template.

FIG. 21 schematically depicts a cross-sectional view taken through a plane extending longitudinally through the actuator. In this embodiment, an imprint template 62 is attached to the face 42 of the actuator. In an embodiment, the imprint template could be the face of the actuator.

Figure 22:
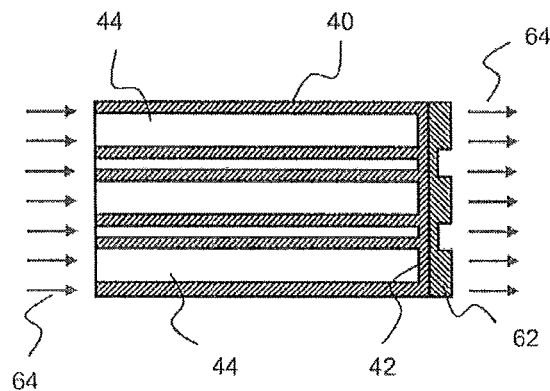
FIG. 22 schematically depicts a modification to the embodiment of FIG. 21, in which the body and face of the actuator, and the imprint template, are transmissive to UV radiation.

FIG. 22 shows a modification to the embodiment shown in FIG. 21. Referring to FIG. 22, the body 40, face 42 and imprint template 62 are all substantially transparent to UV radiation 64 (e.g. radiation having a wavelength of 300 nm-450 nm). As shown in FIG. 22, this means that UV radiation 64 can be transmitted through the actuator and imprint template to, for example, cure an imprintable medium into which the imprint template 62 comes into contact. To achieve this, the body 40, or face 42, or imprint template 62 may be formed from quartz, for example.

Figure 23:
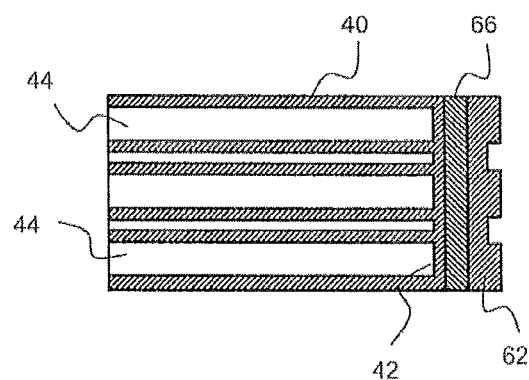
FIG. 23 depicts another modification to the embodiment shown in FIG. 21 and FIG. 22, wherein a diffuser is provided between the conduits of the actuator and the imprint template.

FIG. 23 schematically depicts an addition to the embodiment shown in FIGS. 21 and 22. In FIG. 23 a diffuser 66 is shown as being located between the imprint template 62 and the face 42 of the actuator. The diffuser 66 may diffuse radiation that passes through the actuator and onto and through the imprint template 62. Such diffusion may be advantageous, since the conduits 44 may otherwise, and undesirably, provide a pattern in UV radiation that passes through the actuator, which could result in radiation not being uniformly applied to imprint medium into which the imprint template 62 is imprinted. In an embodiment, the diffuser could be the face of the actuator. A diffuser could be made, for example, from heat resistant glass, optical glass or fused silica.

As discussed above, in use, the pressure of a fluid in one or more of the plurality of conduits 44 may be changed to change the pressure within the conduit 44. The fluid within the conduit 44 may have a refractive index which is substantially the same as a refractive index of the body 40 or face 42 or imprint template 62, such that index matching is achieved so that UV radiation is not refracted to different extents when it passes through the actuator, fluid, and imprint template 6. Index matching is known in the art, and so will not be described in more detail here.

Figure 24:
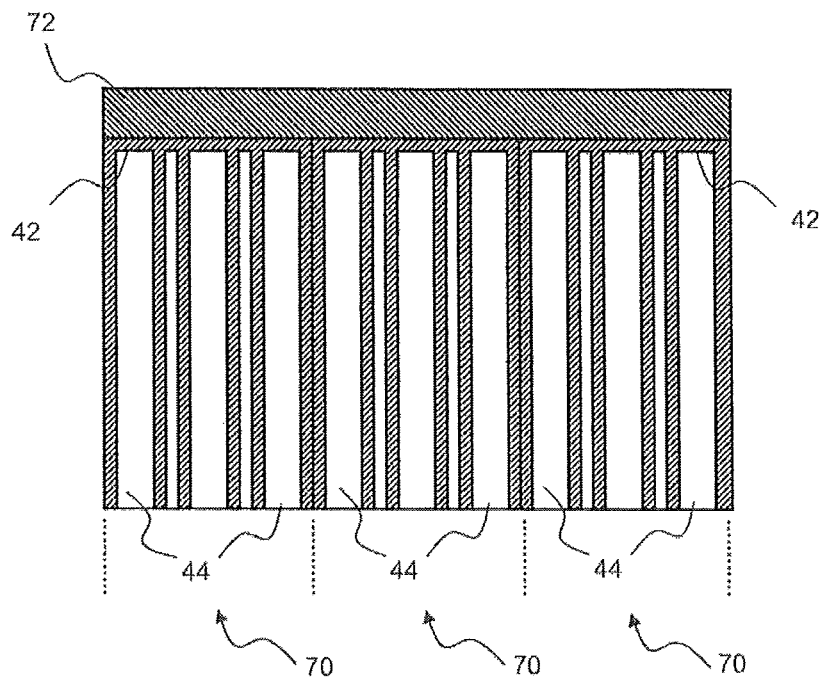
FIG. 24 schematically depicts a plurality of actuators according to an embodiment of the present invention, the actuators being disposed along side one another and attached to or forming part of a substrate holder.

FIG. 24 schematically depicts a further embodiment, in which a plurality of actuators 70 in accordance with an embodiment of the invention are shown as being disposed alongside one another and attached to a substrate holder 72 (for example, a substrate table or the like). The plurality of actuators 70 may be used to selectively deform the substrate holder 72.

Figure 25:
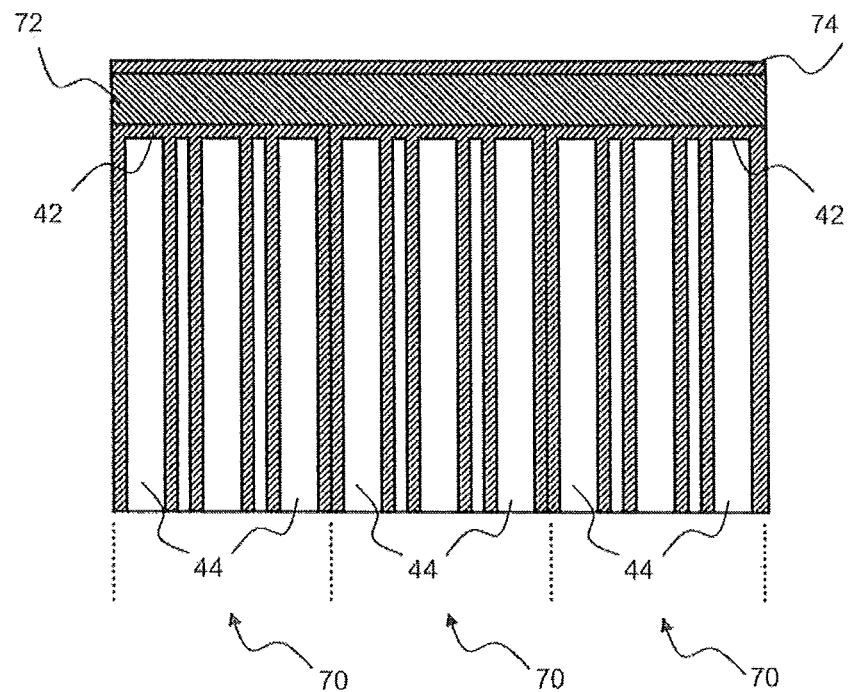
FIG. 25 schematically depicts the embodiment of FIG. 24 but with a substrate positioned on the substrate holder.

FIG. 25 schematically depicts why deformation of the substrate holder 72 might be advantageous. In FIG. 25, a substrate 74 is shown as being held in position on the substrate holder 72. Appropriate deformation of the substrate holder 72 by the actuators 70 can be used to selectively deform selected areas of the substrate 74 itself. Deformation of the substrate 74 may be desirable to, for example, account for or compensate for thermal expansion of the substrate, or to apply a magnification correction which is desired due to, for example, a magnification error in the lithographic apparatus as a whole.

In a further embodiment (not shown), the actuator described in any one of the previous embodiments may comprise one or more conduits which extend substantially parallel to the face of the actuator. The cross-section of each parallel conduit is deformable in response to a change of pressure within the conduit, at least a component of the deformation of the conduit being configured to cause a deformation of the face. If the direction of elongation of the cross section is perpendicular to the face (i.e. in the z-direction of the embodiments described above), and because the conduit in this embodiment extends substantially parallel to the face, deformation of the face will be primarily out-of-plane, as opposed to the primarily in-plane deformation as discussed above. Deformation of the face will also be out-of-plane if the conduit has, for example, a circular cross section.

In the embodiments described above, the conduits have been described as having an elongate cross-section. Such an elongate cross section allows the direction of deformation of the conduit and face of the actuator to be pre-determined (i.e. substantially transverse to the direction of elongation). In other embodiments, expansion in a certain direction may not be required, and instead uniform expansion (e.g. in all directions in the plane of the cross section) may be desirable. Such uniform expansion may be achieved if the cross-section of the conduit is not elongate, but is instead, for example, circular in shape.

In the above embodiments, the use of deformation of the face of the actuator has been described as being advantageous to, for example, correct, compensate or account for, for example, thermal expansion of an imprint template, or a part of a substrate, or the like. However, the deformation may be used for other means, for example to change the degree of curvature of a transmissive element (e.g. a lens) or of a reflective element (e.g. a minor). By changing the degree of curvature of a reflective or transmissive element, for example, a means of changing a property of that element is achieved using the actuator according to an embodiment of the invention. The skilled person, having the benefit of this application, will appreciate that the actuator may find other uses, as well.

In the above described embodiments, the actuator has been described as forming the apparatus to be deformed, or being attached to the apparatus to be deformed. In either example, the actuator may have the dual function of being an actuator for that apparatus, and also a holder or supporter of that apparatus. Because of this dual functionality, a separate apparatus actuator and apparatus holder may not be required, which may result in a decrease in mass in comparison with existing actuator and holder arrangements. Since mass is reduced, the arrangement as a whole may be more easily accelerated/decelerated. Being able to more easily accelerate/decelerate the arrangement may allow higher throughput, for example when the actuator forms part of, or is attached to, an imprint template for use in imprint lithography.

It will be appreciated that the resolution of the deformation of the face of the actuator described above may be dependent on, for example, the number of conduits provided in the actuator, and the size of the cross-section of those conduits. The resolution may therefore be increased by increasing the number of conduits, or alternatively or additionally by decreasing the size of the cross-section of those conduits. The resolution may, alternatively or additionally, be varied by only using a certain number of conduits at any one time. For example, for a given area of the face of the actuator, the deformation resolution may be increased by using a greater number of conduits, or decreased by using a lesser number of conduits.

An embodiment of the present invention relates, in particular to imprint lithography apparatus and methods, and more particularly still to imprint lithography apparatus and methods comprising the use of a plurality of imprint templates (e.g. for the parallel or simultaneous imprinting of a plurality of imprint templates into an imprintable medium), or the use of a single imprint template provided with a plurality of patterned regions for the simultaneous imprint of a plurality of patterns (e.g. into or onto a plurality of dies). This is because the use of the actuator described above for each imprint template allows the imprint templates to be positioned adjacent to one another, with little or no spacing between the templates to accommodate actuators or the like. This allows, for example, the throughput of an imprint lithography process to be improved.

An embodiment of the present invention relates to lithographic (and in particular, imprint lithography) apparatus and methods. The apparatus and/or methods may be used for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, etc.

The described and illustrated embodiments are to be considered as illustrative and not restrictive in character, it being understood that only the preferred embodiments have been shown and described and that all changes and modifications that come within the scope of the inventions as defined in the claims are desired to be protected. It should be understood that while the use of words such as "preferable", "preferably", "preferred" or "more preferred" in the description suggest that a feature so described may be desirable, it may nevertheless not be necessary and embodiments lacking such a feature may be contemplated as within the scope of the invention as defined in the appended claims. In relation to the claims, it is intended that when words such as "a," "an," "at least one," or "at least one portion" are used to preface a feature there is no intention to limit the claim to only one such feature unless specifically stated to the contrary in the claim. When the language "at least a portion" and/or "a portion" is used the item can include a portion and/or the entire item unless specifically stated to the contrary.

The invention claimed is:

1. An actuator comprising:
a body, the body comprising a face; and
a plurality of conduits located in the body, each conduit having a length in a length direction which is greater than a dimension of an elongate cross-section of the conduit, the elongate cross-section extending perpendicularly to the length direction, each conduit having an axis extending along the length direction that intersects the face, and each conduit is deformable in response to a change of pressure within the conduit, the deformation of the conduit configured to cause a deformation of the face,
wherein the elongate cross-section has a length in a long direction larger than a length in a narrow direction perpendicular to the long direction.

2. The actuator of claim 1, wherein the face comprises, or is attached to, at least one apparatus selected from the following apparatuses: a lens element, a reflective element, a transmissive element, a mask element, an imprint lithography template, a substrate holder, or a diffuser.

3. The actuator of claim 1, wherein an end of each conduit is proximate to the face, such that deformation of the conduit causes a deformation of the face.

4. The actuator of claim 1, wherein:
a surface of the face is the same size, or larger than, a cross-section of the body, or,
the face comprises, or is attached to, at least one apparatus selected from the following apparatuses: a lens element, a reflective element, a transmissive element, a mask element, an imprint lithography template, a substrate holder, or a diffuser, and a surface of the face is the same size or smaller than the apparatus.

5. The actuator of claim 1, wherein each conduit is deformable in a direction substantially transverse to the long direction of the elongate cross-section of the conduit, the deformation of the conduit configured to cause a deformation of the face in a direction that is substantially parallel to the direction of deformation of the conduit.

6. The actuator of claim 1, wherein one or more of the plurality of conduits have a cross-section with the long direction in a first direction, and one or more of the plurality of conduits have a cross-section with the long direction in a second, different direction, the first direction being substantially perpendicular to the second direction.

7. The actuator of claim 1, wherein the plurality of conduits extend substantially parallel to one another.

8. The actuator of claim 1, wherein the plurality of conduits extend in a substantially perpendicular direction away from the face.

9. The actuator of claim 1, wherein the elongate cross-section of each conduit has a length in the long direction three times or more larger than a length in the narrow direction.

10. The actuator of claim 1, wherein the elongate cross-section of each conduit has a dimension of about 10 millimeters or less.

11. The actuator of claim 1, wherein the body or face is substantially transmissive to UV radiation.

12. The actuator of claim 1, wherein, in use, the pressure of a fluid in one or more of the plurality of conduits is changed to change the pressure within the conduit, and wherein the fluid has a refractive index which is substantially the same as the refractive index of the body or the face.

13. The actuator of claim 1, wherein the elongate cross-section of each conduit has a shape which is substantially that of: an oval, an ellipse, a rectangle, or a rectangle with one or more rounded corners.

14. The actuator of claim 1, comprising one or more further conduits extending substantially parallel to the face, each parallel conduit deformable in response to a change of pressure within the parallel conduit, the deformation of the further conduit configured to cause a deformation of the face.

15. The actuator of claim 1, further comprising a plurality of actuators disposed substantially adjacent to one another.

16. An actuator comprising:
a body, the body comprising a face; and
a plurality of conduits located in the body, each conduit having a length in a length direction which is greater than a dimension of a cross-section of the conduit, the same cross-section extending perpendicularly to the length direction and parallel to the face, and each conduit is deformable in response to a change of pressure within the conduit, the deformation of the conduit configured to cause a deformation of the face.

17. The actuator of claim 16, wherein each conduit has a cross-section which is elongate, the elongate cross-section having a length in a long direction larger than a length in a narrow direction perpendicular to the long direction, each conduit deformable in a direction substantially transverse to the long direction of the elongate cross-section of the conduit, the deformation of the conduit configured to cause a deformation of the face in a direction that is substantially parallel to the direction of deformation of the conduit.

18. The actuator of claim 16, wherein the face comprises, or is attached to, at least one apparatus selected from the following apparatuses: a lens element, a mirror element, a transmissive element, a mask element, an imprint lithography template, a substrate holder, or a diffuser.

19. The actuator of claim 16, wherein one or more of the plurality of conduits have a cross-section with elongation in a first direction, and one or more of the plurality of conduits have a cross-section with elongation in a second, different direction, the first direction being substantially perpendicular to the second direction.

20. The actuator of claim 16, wherein the plurality of conduits extend in a substantially perpendicular direction away from the face.

21. An actuator comprising:
a body, the body comprising a face; and
a plurality of conduits located in the body, each conduit having a length in a length direction which is greater than a dimension of an elongate cross-section of the conduit, the elongate cross-section extending perpendicularly to the length direction, and each conduit is deformable in response to a change of pressure within the conduit, the deformation of the conduit configured to cause a deformation of the face, wherein the elongate cross-section has a length in a long direction larger than a length in a narrow direction perpendicular to the long direction, and wherein one or more of the plurality of conduits have a cross-section with the long direction in a first direction, and one or more of the plurality of conduits have a cross-section with the long direction in a second, different direction, the first direction being substantially perpendicular to the second direction.

\* \* \* \* \*